United States Patent
Moore

(10) Patent No.: US 7,395,727 B2
(45) Date of Patent: Jul. 8, 2008

(54) STRAIN DETECTION FOR AUTOMATED NANO-MANIPULATION

(75) Inventor: Thomas M. Moore, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 127 days.

(21) Appl. No.: 11/186,072

(22) Filed: Jul. 21, 2005

(65) Prior Publication Data

US 2007/0089528 A1   Apr. 26, 2007

Related U.S. Application Data

(60) Provisional application No. 60/592,332, filed on Jul. 28, 2004.

(51) Int. Cl.
*G01B 5/00* (2006.01)
(52) U.S. Cl. .......................... 73/866.5; 977/849; 33/559
(58) Field of Classification Search .................. 977/860, 977/861, 872, 880, 881; 73/866.5
See application file for complete search history.

(56) References Cited

U.S. PATENT DOCUMENTS

| | | | |
|---|---|---|---|
| 4,074,567 A | | 2/1978 | Horanoff |
| 4,148,215 A | | 4/1979 | Hofstetter, Jr. |
| 4,380,171 A | | 4/1983 | Smith |
| 4,910,877 A | * | 3/1990 | Sokol ........................... 33/544 |
| 5,819,850 A | | 10/1998 | Lee, Jr. et al. |
| 6,148,662 A | * | 11/2000 | Lin .............................. 73/105 |
| 6,527,967 B1 | | 3/2003 | Suzuki |
| 6,788,086 B2 | | 9/2004 | Hantschel et al. |
| 6,795,599 B2 | | 9/2004 | Spirin et al. |
| 2002/0049382 A1 | * | 4/2002 | Suh et al. ..................... 600/449 |
| 2002/0195576 A1 | | 12/2002 | Inoue et al. |
| 2004/0061872 A1 | | 4/2004 | Nakano |
| 2004/0079141 A1 | * | 4/2004 | Brighton et al. ................. 73/84 |

(Continued)

FOREIGN PATENT DOCUMENTS

WO   WO 9709584 A1 *  3/1997

(Continued)

OTHER PUBLICATIONS

Vishay Micro-Measurements. M-Bond 43-B Datasheet. Rev. Jan. 10, 2003. Accessed online on Dec. 4, 2007. <http://www.vishay.com/accessories/adhesives/>.*

*Primary Examiner*—Edward Lefkowitz
*Assistant Examiner*—Punam Patel
(74) *Attorney, Agent, or Firm*—John A. Thomas

(57) ABSTRACT

A strain detector for in-situ lift-out, comprises a nano-manipulator probe shaft; a strain gauge mounted on the probe shaft; and a first cut-out on the probe shaft. The first cut-out has a rectangular cross-section. There is a second cut-out on the probe shaft; the second cut-out having a semicircular cross-section. The second cut-out is positioned on the shaft opposite from the first cut-out; the first and second cut-out, thus defining a thinned region in the probe. The strain gauge is mounted on the probe shaft at the location of the thinned region. There is detecting circuitry for detecting, amplifying and conditioning the output of the strain gauge; and, wires electrically connecting the strain gauge to the detection circuitry. The wires are preferably located in a trench in the probe shaft. Other embodiments are disclosed having multiple strain gauges and detectors.

9 Claims, 2 Drawing Sheets

U.S. PATENT DOCUMENTS

| | | |
|---|---|---|
| 2004/0103724 A1 | 6/2004 | Takizawa et al. |
| 2004/0125079 A1 | 7/2004 | Kaneko et al. |
| 2004/0129867 A1 | 7/2004 | Mackey |
| 2004/0129868 A1 | 7/2004 | Kitmartin |
| 2004/0142409 A1 | 7/2004 | Allen et al |
| 2004/0151417 A1 | 8/2004 | Lagakos et al. |
| 2006/0107768 A1 | 5/2006 | Johnson et al. |

FOREIGN PATENT DOCUMENTS

| | |
|---|---|
| WO | WO 03049908 A1 * 6/2003 |

* cited by examiner

STRAIN DETECTION FOR AUTOMATED NANO-MANIPULATION

CLAIM TO PRIORITY

This application claims the priority of U.S. provisional application Ser. No. 60/592,332, filed Jul. 28, 2004 and having the title of "Strain detection for automated nano-manipulation."

TECHNICAL FIELD

This disclosure relates to the removal of specimens inside focused ion-beam (FIB) microscopes and the preparation of specimens for later analysis in the transmission electron microscope (TEM), and apparatus to facilitate these activities. This disclosure also relates to the mechanical testing of materials and tiny structures outside a FIB.

BACKGROUND

The use of In-Situ Lift-Out (INLO) for TEM sample preparation in the FIB has become a popular and widely accepted technique. INLO enables the preparation of multiple site-specific TEM samples, at different angles of inspection, and with the imaging resolution of a Scanning Electron Microscope (SEM), without the need for an expensive wet lab for conventional sawing, polishing and grinding, and without the need to sacrifice the wafer being inspected. The ability to perform process control on 300 mm diameter wafers without sacrificing wafers for the inspection is very important because of the value of these wafers.

However, accurate process control requires high throughput TEM sample preparation. Automation of the sample preparation process will significantly and favorably impact the analytical throughput of this process and its repeatability.

A key apparatus for INLO is an in-situ nano-manipulator that enables full wafer analysis, such as the AutoProbe 200™ manufactured by Omniprobe, Inc. This nano-manipulator can be used to lift-out a tiny wedge-shaped portion (typically 5×5×10 µm) of the sample and to transfer it to a TEM sample holder that is also present in the FIB vacuum chamber.

Ion or electron-beam assisted deposition of metal or other materials from appropriate source gases injected near the surface in the FIB can be used to attach the nano-manipulator probe tip to the excised lift-out sample. The same beam-assisted gas chemistry can be used to attach the lift-out sample to the TEM sample holder. Later, the ion beam in the FIB can be used to detach the probe tip from the lift-out sample, completing the in-situ transfer of the lift-out sample to the TEM sample holder. This lift-out sample can then be thinned to an appropriate thickness for TEM inspection (<100 nm).

Surface contact detection is a critical element of the automation of such a nano-manipulator-based operation. One of the methods that can be used to determine that the contact between the nano-manipulator probe tip and the sample surface has been made is electrical continuity detection. This method is impractical for automation due to several reasons. If the sample surface is non-conductive, the detection of the steady-state electrical continuity between the probe tip and the sample surface will not be successful. Even if the sample surface is electrically conductive, it may not be electrically connected to the sample holder, or there may be a tough native oxide on the conductive surface making continuity detection difficult. Without an electrical connection to the sample holder, continuity detection between the probe tip and sample surface will be difficult in the FIB environment. Detection of a transient electrical response due to the connection of the charged sample surface with the probe tip is also impractical for repetitive automated procedures because this effect is time and material dependent and also depends on the behavior of the charged particle beams impinging the surface.

A metal layer that covers the surface of the sample and electrically connects the surface and the sample stage may be deposited using an appropriate gas source and electron or ion beam assisted deposition in the FIB. Such a deposition operation is time consuming in the FIB, however, and may render the wafer useless for further processing. In addition, the ion beam may locally remove the metal layer at the place where the probe tip makes contact with a sample surface and hence defeat the purpose of the inspection.

What is needed is a safe and reliable method of detecting contact between the sample and the probe of the nano-manipulator, whether inside or outside of a FIB.

SUMMARY

We disclose a strain detector for in-situ lift-out, comprising a nano-manipulator probe shaft; a strain gauge mounted on the probe shaft; and a first cut-out on the probe shaft. The first cut-out has a rectangular cross-section. There is a second cut-out on the probe shaft; the second cut-out having a semi-circular cross-section. The second cut-out is positioned on the shaft opposite from the first cut-out; the first and second cut-outs thus defining a thinned region in the probe. The strain gauge is mounted on the probe shaft at the location of the thinned region. There is detecting circuitry for detecting, amplifying and conditioning the output of the strain gauge; and, wires electrically connecting the strain gauge to the detection circuitry. The wires are preferably located in a trench in the probe shaft.

DRAWINGS

DESCRIPTION

A sensitive strain gauge mounted in the probe shaft of the nano-manipulator can function as an efficient surface contact detector in the FIB. Such a detection method based on mechanical strain in the probe shaft is independent of electrical continuity effects and will function efficiently on any type of sample surface. The sensitivity of such a method depends on the type of strain gauge used, the detection circuitry, the position of the strain gauge on the shaft, and the mechanical design of the probe shaft. In the preferred embodiment, a tiny (<1 mm$^2$) electrical resistance-based silicon strain gauge is effectively used to measure the level of strain necessary for reliable automation of surface contact detection. Other types of strain gauges may also be used, such as resistive foil gauges, or semiconductor strain gauges manufactured by using photolithography masking and solid-state diffusion, instead of adhesive bonding. In the latter type of strain gauge, the electrical leads are attached directly to the strain-gauge pattern.

Figure 1:
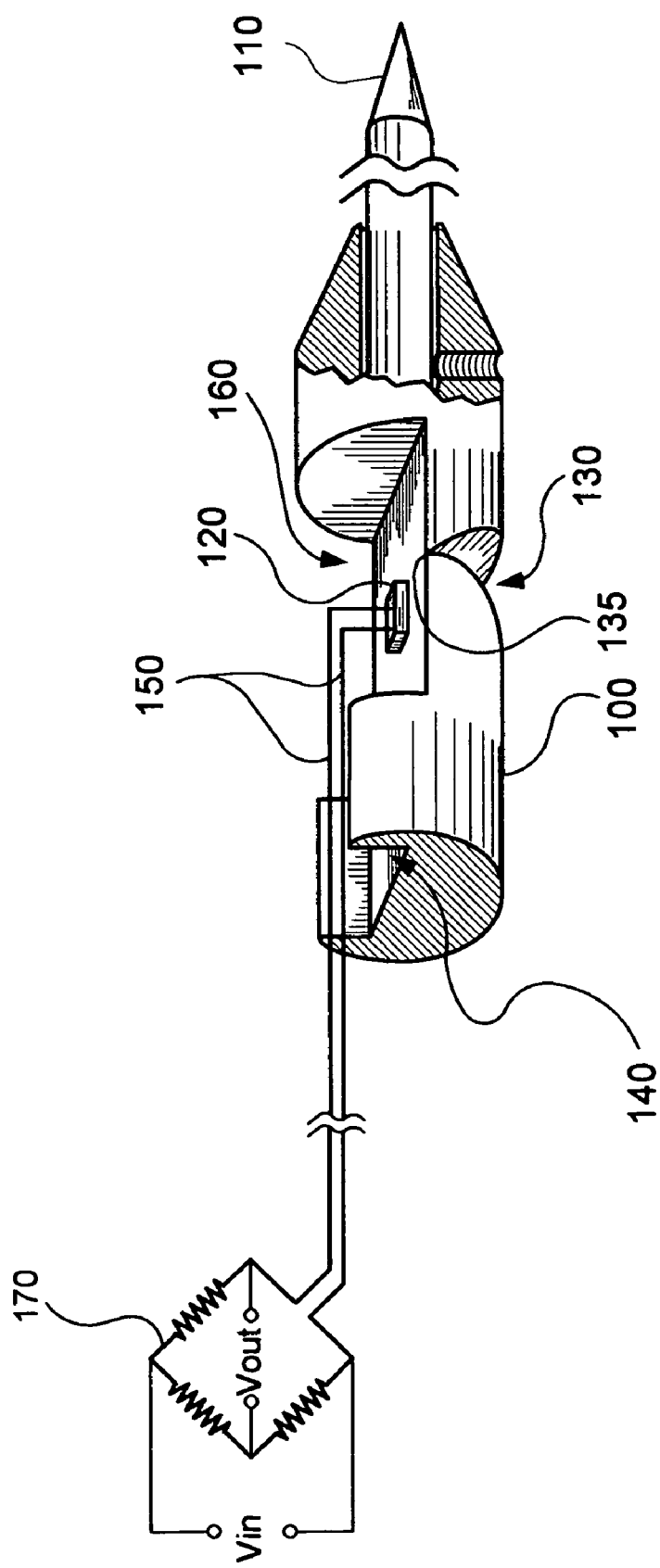
FIG. 1 shows a perspective view of the preferred embodiment, depicting a modified probe shaft with a strain gauge attached to it.

FIG. 1 shows a three-dimensional view of a modified probe shaft (100) with a strain gauge (120) attached to it. There are two cut-outs on a probe shaft surface, one is of rectangular cross-section (160), and another one is of triangular or semi-circular (arched) cross-section (130), and they are located on the opposite sides of the probe shaft (100) directly opposite each other creating a very thin section (135) of the probe shaft. There is also a trench (140) in the probe shaft, which continues along the length of the probe shaft (100) from the border of the rectangular cut-out (160) to the external end of the probe shaft (100).

In the preferred embodiment, the strain gauge (120) is located at the median of the rectangular probe shaft cut-out (160), exactly on the very thin section of the probe shaft (100), created by the intersection of two cut-outs (130 and 160). The triangular or semi-circular cut-out (130), which serves as the "sensitivity cut-out", reduces the absolute stiffness of the probe shaft (100) and concentrates the strain at the strain gauge (120) location. The strain gauge (120) can be attached to a probe shaft surface with a high elastic modulus adhesive, such as epoxy. Electrical connection between the strain gauge (120) and the detection circuitry (170) can be made using wires (150) that follow the trench (140) running along the axis of the probe shaft (100). The wires (150) are connected to detection circuitry (170) for detecting, amplifying and conditioning the output of the strain gauge (120). For a resistance-based strain gauge, a conventional Wheatstone bridge can be used to detect subtle changes in the strain gauge resistance which can be fed back to the computer control system to indicate load on the probe tip (110). In the figures, a conventional Wheatstone bridge represents the detector circuitry (170), but the reader should understand this as an example. In practice, the detector circuitry (170) would include amplification and signal conditioning elements, as is known in the art.

The modified probe shaft (100) can be manufactured using several methods, such as machining, which is difficult with such a small object. Preferable alternatives are laser machining and electrical discharge machining methods.

Figure 2:
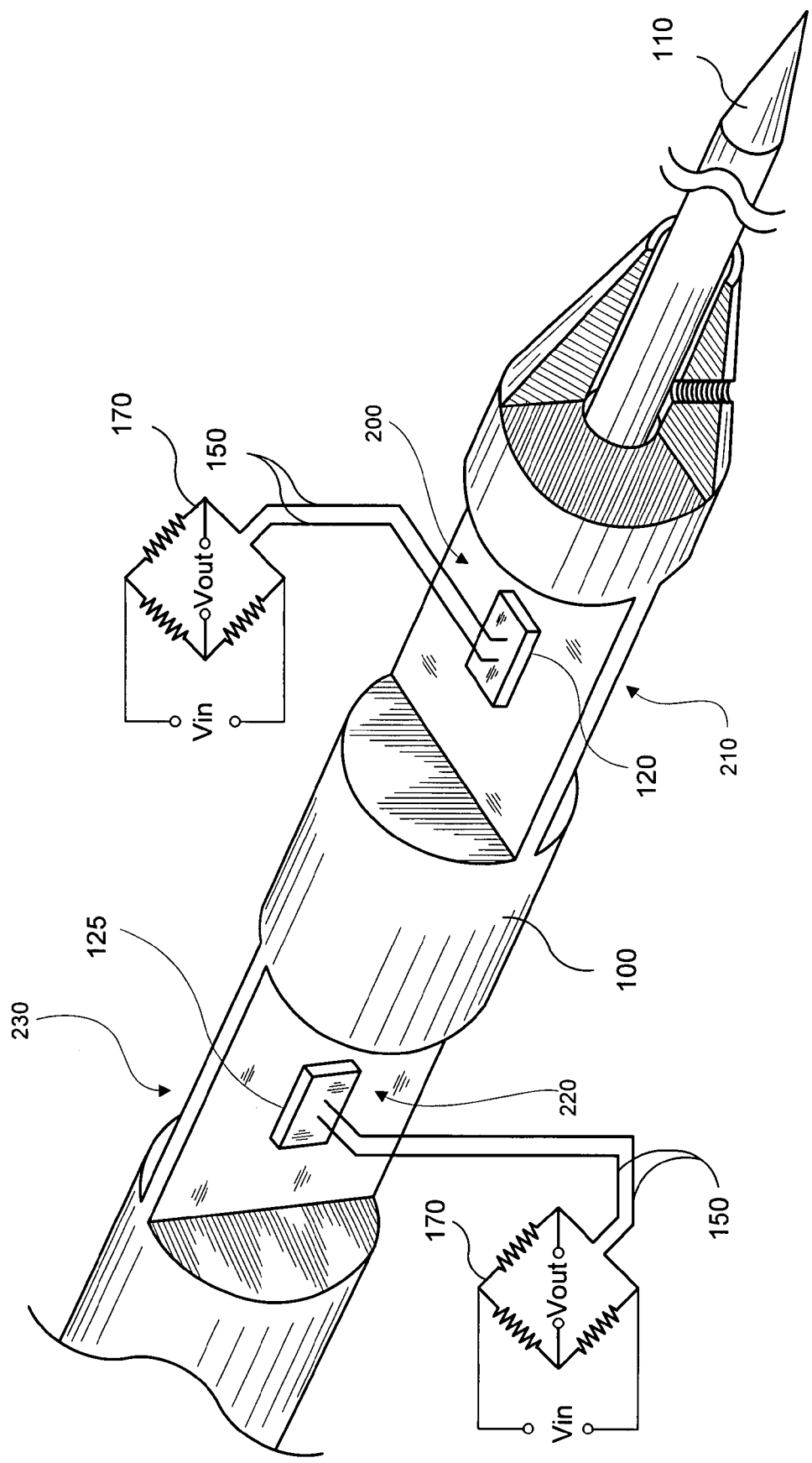
FIG. 2 shows another embodiment, depicting multiple strain gauges.

The single strain-gauge system described above can detect strain in one dimension of deflection of the probe tip. In another embodiment, an additional second strain gauge (125) can be mounted at the same or different location along the probe shaft and perpendicular to the first strain gauge (120). This additional strain gauge (125) requires a similar mechanical design of the probe shaft (100), including a local reduction in the probe shaft diameter for increased sensitivity, which reduction can be the triangular or rectangular cross-sections discussed above and shown in FIG. 1. or rectangular cross-sections as shown in FIG. 2. As shown in FIG. 2, the first strain gauge (120) is mounted in the first cut-out (200) adjacent to a second cut-out (210) in the probe shaft (100), and the second strain gauge (125) is mounted in the third cut-out (220) adjacent to a corresponding fourth cut-out (230).

In general, the apparatus just described may be used as follows: First, the target location for the touch-down of the probe shaft (100) is defined by moving the nano-manipulator to a position above the target location. The output of the detector (170) is monitored while the nano-manipulator is moving towards the target location. When the output of the detector (170) is a touch-down signal, that is, strain signifying contact, the nano-manipulator is stopped.

I claim:
1. A strain detector for in-situ lift-out, comprising:
a probe shaft;
a first cut-out on the probe shaft;
a second cut-out on the probe shaft, the second cut-out opposite from the first cut-out; the first and second cut-outs defining a first thinned region in the probe shaft;
a first strain gauge mounted on the probe shaft at the location of the first thinned region;
a third cut-out on the probe shaft;
a fourth cut-out on the probe shaft, the fourth cut-out opposite from the third cut-out; the third and fourth cut-outs defining a second thinned region in the probe shaft;
where the first and third cut-outs have a triangular cross-section;
a second strain gauge mounted on the probe shaft at the location of the second thinned region;
where the second strain gauge is located substantially perpendicular to the first strain gauge.

2. The strain detector of claim 1, where the first and second strain gauges are resistance-based strain gauges.

3. The strain detector of claim 2, where the first and second strain gauges are silicon strain gauges.

4. The strain detector of claim 3, further comprising:
detection circuitry for detecting, amplifying and conditioning the output of the first and second strain gauges; and,
wires electrically connecting the strain gauges to the detection circuitry.

5. The strain detector of claim 4 where the detection circuitry comprises at least one Wheatstone bridge.

6. The strain detector of claim 2 where the resistance-based strain gauges are each smaller in cross-sectional area than one square millimeter.

7. The strain detector of claim 2,
where the surface of the first cut-out and the third cut-out comprise an adhesive for mounting the first and second strain gauges respectively to the probe shaft.

8. The strain detector of claim 7, where the adhesive is epoxy.

9. A strain detector for in-situ lift-out, comprising:
a probe shaft;
a first cut-out on the probe shaft;
a second cut-out on the probe shaft, the second cut-out opposite from the first cut-out; the first and second cut-outs defining a first thinned region in the probe shaft;
a first strain gauge mounted on the probe shaft at the location of the first thinned region;
a third cut-out on the probe shaft;
a fourth cut-out on the probe shaft, the fourth cut-out opposite from the third cut-out; the third and fourth cut-outs defining a second thinned region in the probe shaft;
where the second and fourth cut-outs have a semi-circular cross-section;
a second strain gauge mounted on the probe shaft at the location of the second thinned region;
where the second strain gauge is located substantially perpendicular to the first strain gauge.

* * * * *